United States Patent
Chen

(10) Patent No.: US 10,580,505 B1
(45) Date of Patent: Mar. 3, 2020

(54) ERASING METHOD USED IN FLASH MEMORY

(71) Applicant: ELITE SEMICONDUCTOR MEMORY TECHNOLOGY INC., Hsinchu (TW)

(72) Inventor: Chih-Hao Chen, New Taipei (TW)

(73) Assignee: ELITE SEMICONDUCTOR MEMORY TECHNOLOGY INC. (TW)

( * ) Notice: Subject to any disclaimer, the term of this patent is extended or adjusted under 35 U.S.C. 154(b) by 0 days.

(21) Appl. No.: 16/281,517

(22) Filed: Feb. 21, 2019

(51) Int. Cl.
*G11C 16/34* (2006.01)

(52) U.S. Cl.
CPC ...... *G11C 16/3445* (2013.01); *G11C 16/3472* (2013.01)

(58) Field of Classification Search
CPC .................. G11C 16/3445; G11C 16/3472
See application file for complete search history.

(56) References Cited

U.S. PATENT DOCUMENTS

| | | | | |
|---|---|---|---|---|
| 7,266,017 B2 * | 9/2007 | Harari | ............ | G06F 3/0601 365/185.03 |
| 7,283,397 B2 * | 10/2007 | Harari | ............ | G06F 3/0601 365/185.03 |
| 7,362,618 B2 * | 4/2008 | Harari | ............ | G06F 3/0601 365/185.03 |

* cited by examiner

*Primary Examiner* — Gene N Auduong
(74) *Attorney, Agent, or Firm* — Schmeiser, Olsen & Watts, LLP

(57) ABSTRACT

An erasing method used in a flash memory having memory blocks is illustrated, each of the memory blocks is divided into a plurality of memory sectors, and steps of the erasing method is illustrated as follows. An erasing and verifying process is performed sequentially on the memory blocks or the memory sectors of the memory block according to a memory sector enable signal. An over-erased correcting and verifying process is performed sequentially on the memory blocks or the memory sectors of the memory block according to the memory sector enable signal, wherein the memory sector enable signal is set to be asserted if an over-erased correction is performed on at least one of the memory blocks or at least one of the memory sectors of the memory block.

14 Claims, 3 Drawing Sheets

ERASING METHOD USED IN FLASH MEMORY

FIELD OF THE INVENTION

The present disclosure relates to a flash memory, and in particular to an erasing method used in a flash memory.

BACKGROUND OF THE INVENTION

A flash memory includes individual Metal-Oxide-Semiconductor (MOS) field effect transistor memory cells, each of which includes a source, a drain, a floating gate and a control gate. Various voltages are applied to the control gate to program the transistor memory cell with a binary 1 or 0, to erase all of the transistor memory cells as a memory block, to read the transistor memory cell, to verify that the transistor memory cell is erased or to verify that the transistor memory cell is not over-erased.

The undesirable effect of the leakage current from the over-erased transistor memory cells is described as follows. In a typical flash memory, the drains of a large number of transistor memory cells, for example 512 transistor memory cells are connected to each bit line. If a substantial number of transistor memory cells on the bit line are drawing background leakage current, the total leakage current on the bit line may exceed the cell read current. This makes it impossible to read the state of any transistor memory cell on the bit line, and therefore renders the flash memory inoperative.

To overcome the above problems, the over-erased correcting and verifying process and the post over-erased correcting and verifying process are performed on the transistor memory cells, such that the bit line leakage current of the over-erased transistor memory cell can be cured. However, some of the erased transistor memory cell may change to the under-erased transistor memory cell after the over-erased correcting and verifying process and the post over-erased correcting and verifying process are performed.

Referring to FIG. 1, FIG. 1 is flow chart of a conventional erasing method. The conventional erasing method is used to make the under-erased transistor memory cell be erased by performing step S15 after the over-erased correcting and verifying process and the post over-erased correcting and verifying process are performed. The conventional erasing method is executed in a flash memory which comprises a memory management apparatus and a memory module, wherein the memory module comprises a plurality of memory blocks, and each of the memory blocks comprises a plurality of transistor memory cells.

In FIG. 1, at step S11, the memory management apparatus verifies and pre-programs all transistor memory cells of the memory module. Next, at step S12, the memory management apparatus verifies and erases all of the transistor memory cells as a memory block, and that is, the erasing unit is one memory block. It is noted that, in the conventional erasing method, two erasing and verifying processes are performed, wherein step S11 is the first erasing and verifying process while step S15 is the second erasing and verifying process.

Next, to prevent the leakage current of the over-erased transistor memory cell from rendering the flash memory inoperative, at step S13, the memory management apparatus verifies all transistor memory cells of the memory module and performs the over-erased correction (OEC) on the over-erased transistor memory cell(s) of the memory module while the verification result shows at least one over-erased transistor memory cell exists in the memory block. Next, at step S14, the memory management apparatus performs the post over-erased correcting and verifying process to the transistor memory cells of the memory module.

Then, step S15 is executed, the memory management apparatus verifies and erases all of the transistor memory cells as a memory block, so as to correct the threshold voltage of the under-erased transistor memory cell(s) after the over-erased correcting and verifying process and the post over-erased correcting and verifying process are performed, and to make the under-erased transistor memory cells be erased. It is noted that, if the verification result of step S15 shows the memory block should not be erased (i.e. the memory block is not erased), the conventional erasing method is terminated; otherwise (i.e. the memory block is erased), step S13 through S15 are executed again.

Though the threshold voltage of the under-erased transistor memory cell(s) can be corrected after the over-erased correcting and verifying process and the post over-erased correcting and verifying process are performed, the do-loop of the conventional erasing method may be required, and erasing time of step S15 may be required before and after cycling, thus making the conventional erasing method extremely time-consuming.

To reduce the execution time of the conventional erasing method, another one convention erasing method is proposed. Referring to FIG. 2, FIG. 2 is flow chart of a conventional erasing method. The conventional erasing method of FIG. 2 is executed in a flash memory as mentioned above, in particular, an OEC flag is used to determine whether the erasing and verifying process should be performed again.

At step S21, the memory management apparatus verifies and pre-programs all transistor memory cells of the memory module. Next, at step S22, an erasing and verifying process and an over-erased correcting and verifying process are performed by the memory management apparatus, and the OEC flag is used to determine whether to perform the erasing and verifying process again, such that the threshold voltage of the under-erased transistor memory cell(s) can be corrected after the over-erased correcting and verifying process is performed. Next, at step S23, the memory management apparatus performs the post over-erased correcting and verifying process to the transistor memory cells of the memory module, and then the conventional erasing method is terminated.

Step S22 comprises steps S221 through S224, and details of steps S221 through S224 are illustrated as follows. At step S221, the memory management apparatus verifies and erases all of the transistor memory cells as a memory block, and specifically, if the verification result shows the memory block should be erased, the memory management apparatus make at least one erase pulse injected to the transistor memory cells of the memory block for the objective of erasing. At step S221, if the memory block is erased, the memory management apparatus sets an erasing flag (hereinafter, abbreviated as "ERS flag") to be logically true (i.e. value of "1"). Next, at step S222, the memory management apparatus checks the value of the ERS flag. If the ERS flag is logically true, step S223 is then executed; otherwise (i.e. ERS flag is logically false or "0"), step S23 is then executed.

At step S223, the memory management apparatus verifies all transistor memory cells of the memory module and performs the OEC on the over-erased transistor memory cell(s) of the memory module by executing at least one OEC pulse (i.e. injecting the OEC pulse to the transistor memory cells) while the verification result shows at least one over-erased transistor memory cell exists in the memory block. At step S223, the memory management apparatus sets the OEC flag to be logically true (i.e. value of "1") if the OEC is performed on the memory block. Next, at step S224, the memory management apparatus checks the value of the OEC flag. If the OEC flag is logically true, step S221 is then executed again; otherwise (i.e. OEC flag is logically false or "0"), step S23 is then executed.

By using the OEC flag, the conventional erasing method of FIG. 2 can save erasing time before cycling (i.e. whether to executed step S221 is determined by the OEC flag). However, the do-loop between the erasing and verifying process (step S221) and the over-erased correcting and verifying process (step S223) may be still required, and the execution time of the conventional erasing method of FIG. 2 is not shortened sufficiently.

SUMMARY OF THE INVENTION

One objective of the present disclosure is to provide an erasing method used in a flash memory, and the erasing method has a self-examining algorithm to prevent the existence of the under-erased transistor memory cell after the OEC is performed. Meanwhile, the do-loop between the erasing and verifying process and the over-erased correcting and verifying process can be eliminated under the assumption that the slow and fast transistor memory cell do not allocated in multiple bits (such as 16 bits) on a same bit line of a memory sector.

Another one objective of the present disclosure is to provide a flash memory which executes the above erasing method, and the flash memory has the similar advantages as those of the erasing method.

To achieve at least the above objective, the present disclosure provides an erasing method used in a flash memory comprising at least one memory block divided into a plurality of memory sectors. The erasing method comprises steps of: performing an erasing and verifying process on the memory block, and setting an erasing flag to be logically true if the memory block is erased; performing an over-erased correcting and verifying process on the memory block if the erasing flag is logically true, setting an over-erased correction flag to be logically true and a memory sector enable signal to be asserted if an over-erased correction is performed on the memory block, and then resetting both of the erasing flag and the over-erased correction flag to be logically false; when the memory sector enable signal is asserted, performing the erasing and verifying process sequentially on the memory sectors of the memory block, and setting the erasing flag to be logically true if at least one of the memory sectors is erased; and when the memory sector enable signal is asserted and the erasing flag is logically true, performing the over-erased correcting and verifying process sequentially on the memory sectors of the memory block, setting the over-erased correction flag to be logically true if the over-erased correction is performed on at least one of the memory sectors, and then resetting both of the erasing flag and the over-erased correction flag to be logically false.

In one embodiment of the present disclosure, the at least one memory block comprises a plurality of memory blocks, and the erasing and verifying process is sequentially performed on the memory blocks, wherein an address is used to indicate the memory block or the memory sector, the address is increased with a block offset after a verification result shows the memory block has no under-erased transistor memory cell, and the erasing flag is set to be logically true if at least one of the memory block is erased.

In one embodiment of the present disclosure, the over-erased correcting and verifying process is sequentially performed on the memory blocks if the erasing flag is logically true, the over-erased correction flag is set to be logically true and the memory sector enable signal is to be asserted if an over-erased correction is performed on at least one of the memory blocks, and then both of the erasing flag and the over-erased correction flag are reset to be logically false.

In one embodiment of the present disclosure, the erasing and verifying process is performed on the memory sector of the memory block which the address indicates, the address is increased with a sector offset after a verification result shows memory sector of the memory block has no under-erased transistor memory cell, and the erasing flag is set to be logically true if at least one of the memory sectors of the memory block is erased.

In one embodiment of the present disclosure, before the erasing and verifying process on the memory block is performed on the memory block, a pre-programming and verifying process is performed on the memory block.

In one embodiment of the present disclosure, when the memory block or the memory sectors have no under-erased transistor memory cell and the erasing flag is logically false, or the memory block has no over-erased transistor memory cell and the memory sector enable signal is not asserted, or the memory sectors has no over-erased transistor memory cell and the memory sector enable signal is asserted, a post over-erased correcting and verifying process is performed on the memory block.

To achieve at least the above objective, the present disclosure provides an erasing method used in a flash memory comprising at least one memory block divided into a plurality of memory sectors. The erasing method comprises steps of: performing an erasing and verifying process sequentially on the memory blocks or the memory sectors of the memory block according to a memory sector enable signal, and setting an erasing flag to be logically true if at least one of the memory blocks or at least one of the memory sectors is erased; and performing an over-erased correcting and verifying process sequentially on the memory blocks or the memory sectors of the memory block according to the memory sector enable signal if the erasing flag is logically true, setting an over-erased correction flag to be logically true and the memory sector enable signal to be asserted if an over-erased correction is performed on at least one of the memory blocks or at least one of the memory sectors of the memory block, and then resetting both of the erasing flag and the over-erased correction flag to be logically false.

In one embodiment of the present disclosure, when the memory sector enable signal is not asserted, the erasing and verifying process is performed sequentially on the memory blocks, and the over-erased correcting and verifying process is performed sequentially on the memory blocks; when the memory sector enable signal is asserted, the erasing and verifying process is performed sequentially on the memory sectors, and the over-erased correcting and verifying process is performed sequentially on the memory sectors.

To achieve at least the above objective, the present disclosure provides a flash memory comprising a memory module and a memory management apparatus electrically connected to the memory module, wherein the memory module comprises at least one memory block divided into a plurality of memory sectors. The memory management apparatus is used to execute the above erasing method.

To sum up, the erasing method the flash memory provided according to the embodiments of the present disclosure can check whether the memory sector has at least one under-erased transistor memory cell after the OEC is performed, and erase the memory sector if the memory sector has at least one under-erased transistor memory cell after the OEC is performed, such that a self-examining algorithm is executed to prevent the transistor memory cell from being under-erased after the OEC is performed. Moreover, since the self-examining algorithm verifies and erases the memory

DETAILED DESCRIPTION OF THE PREFERRED EMBODIMENTS

To make it easier for the examiner to understand the objects, characteristics and effects of this present disclosure, embodiments together with the attached drawings for the detailed description of the present disclosure are provided.

An embodiment of the present disclosure provides an erasing method used in a flash memory to prevent the do-loop between the erasing and verifying process and the over-erased correcting and verifying process. Specifically, a self-examining algorithm is executed to prevent the existence of the under-erased transistor and to eliminate the do-loop between the erasing and verifying process and the over-erased correcting and verifying process memory after the OEC is performed.

In the self-examining algorithm, all of the transistor memory cells are erased and over-erased corrected as a memory sector, and that is, the erasing unit and the over-erased correcting unit are one memory sector, wherein a memory block is divided to a plurality of memory sectors. For example, the memory block has 64K bytes (64K*8 bits), the memory sector has 4K bytes (4K*8 bits), and the present disclosure is not limited thereto.

Usually, the fast bit and the slow bit are not allocated at on a same bit line of the memory sector, and thus the erasing method makes the under-erased transistor not exist in the memory sector after the memory sector is erased and over-erased corrected. Furthermore, since whether the memory sector has the over-erased transistor memory cell is also checked and the same bit line of the memory sector usually does not have the fast bit an slow bit thereon, the self-examining algorithm can further eliminate the do-loop between the erasing and verifying process and the over-erased correcting and verifying process memory after the OEC is performed. The details of the erasing method having such self-examining algorithm are illustrated as follows.

Figure 1:
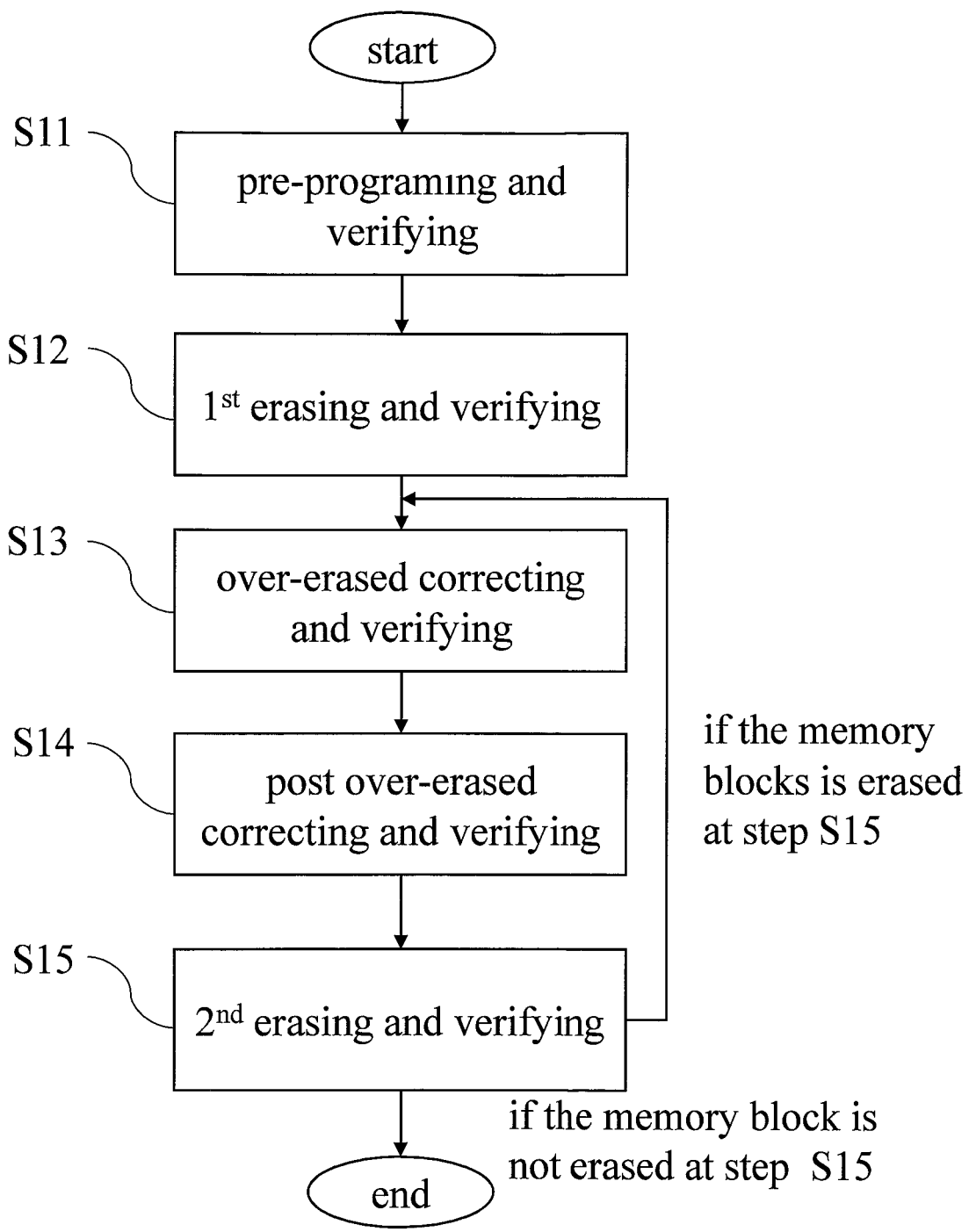
FIG. 1 (related art) is a flow chart of a conventional erasing method.
Figure 2:
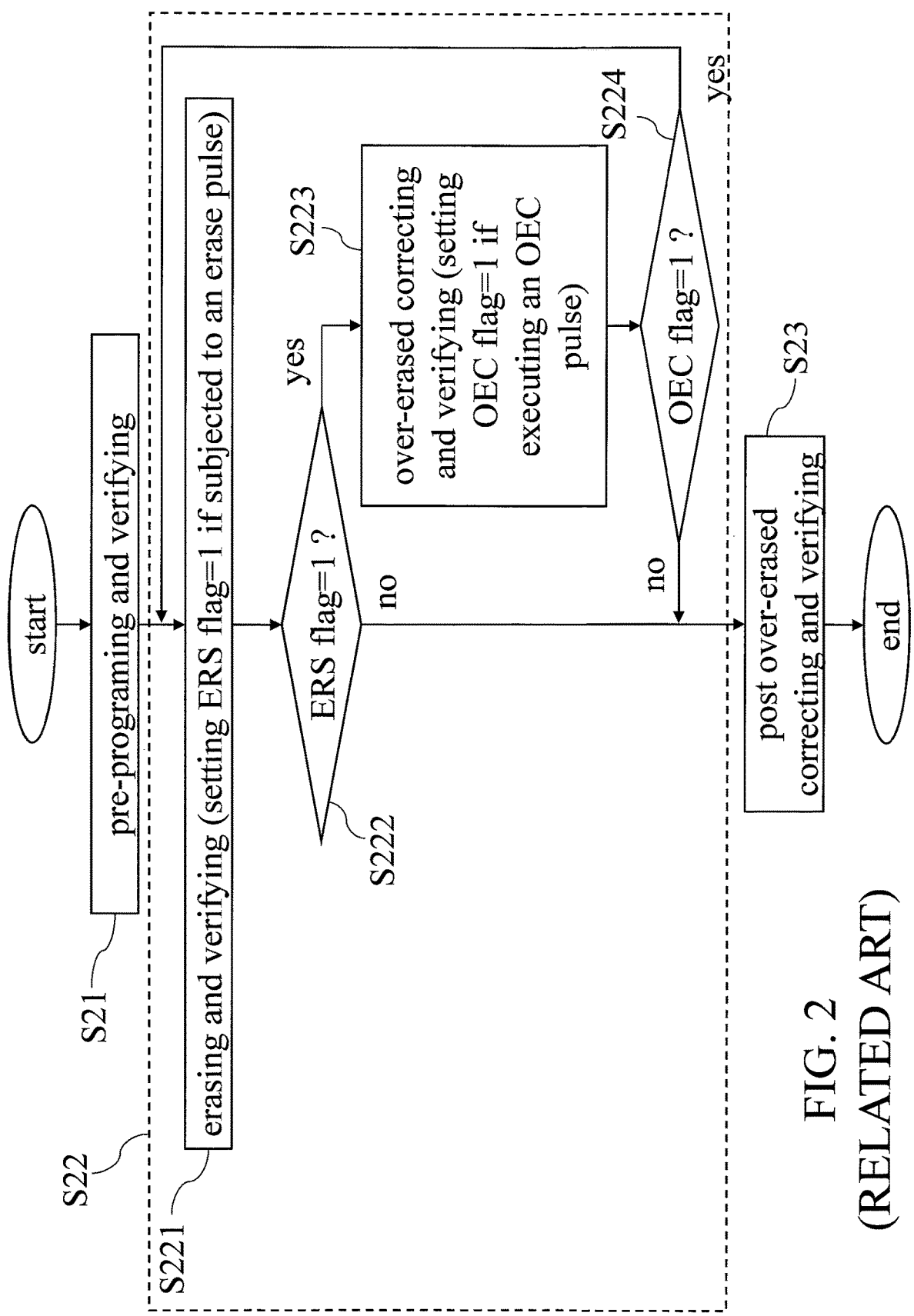
FIG. 2 (related art) is a flow chart of another one conventional erasing method.
Figure 3:
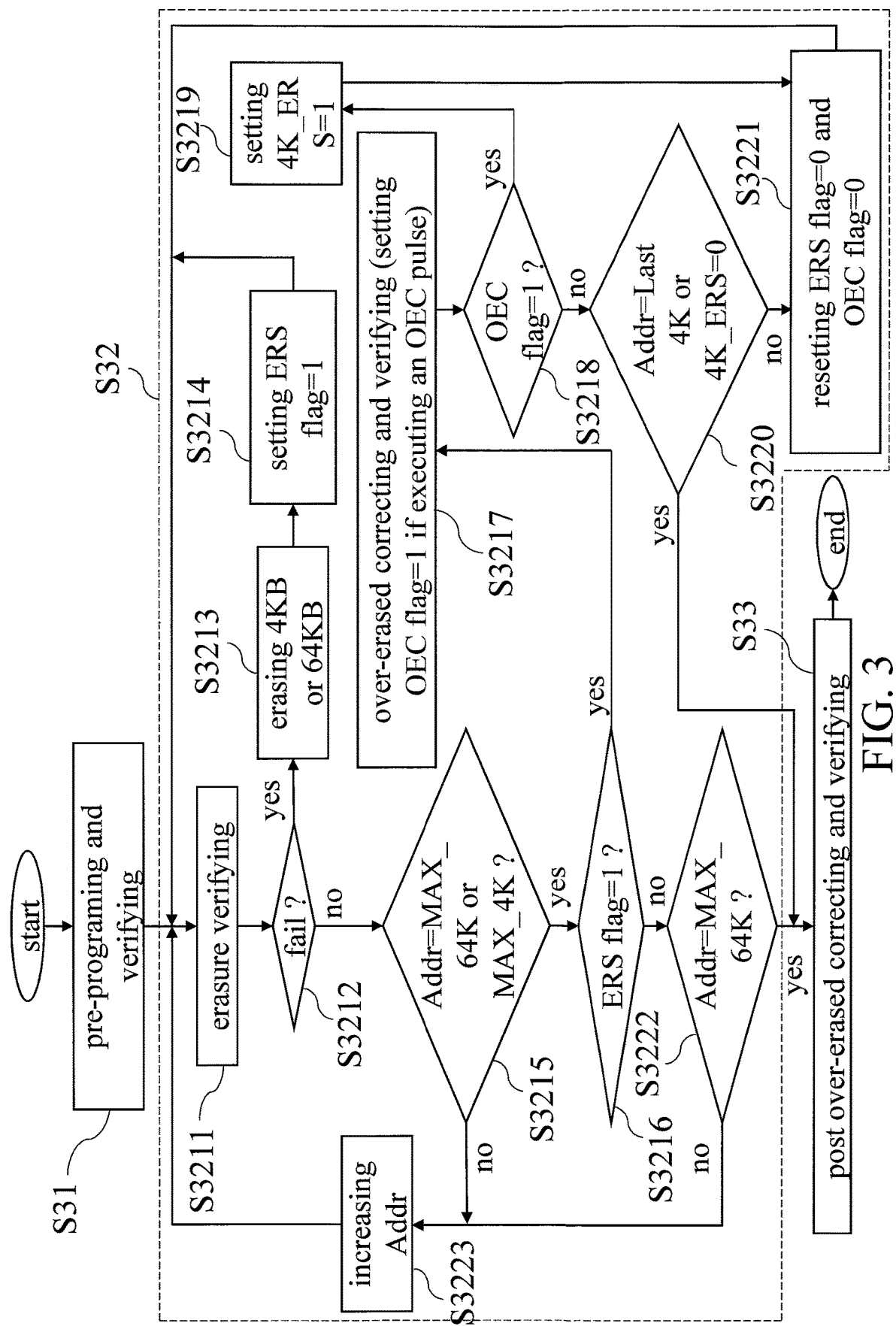
FIG. 3 is a flow chart of an erasing method used in a flash memory according to one embodiment of the present disclosure.

Referring to FIG. 3, FIG. 3 is a flow chart of an erasing method used in a flash memory according to one embodiment of the present disclosure. The erasing method is used in a flash memory comprising a memory management apparatus and a memory module, wherein the memory module can have a plurality of memory banks, each of the memory banks comprises a plurality of memory blocks, and each of the memory blocks can be divided into a plurality of memory sectors. For example, the memory block has 64K bytes (i.e. 64K*8 transistor memory cells), the memory sector has 4K bytes (i.e. 4K*8 transistor memory cells), and the present disclosure is not limited thereto. The memory management apparatus is used to execute the erasing method.

At step S31, the memory management apparatus performs the pre-programming and verifying process on the transistor memory cells of the memory module. Then, at step S32, the erasing and verifying process is sequentially performed on all of the memory blocks to erase the transistor memory cells of the memory blocks, and then the over-erased correcting and verifying process is sequentially performed on the memory blocks. At step S32, if the memory blocks has at least one over-erased transistor memory cell, the OEC is performed on the memory block(s) which has the least one over-erased transistor memory cell (i.e. the memory management apparatus injects the OEC shot to the memory block(s) having the at least one over-erased transistor memory cell), and the memory sector enable signal is set to be asserted (i.e. the 4K_ERS flag is 1 or logically true).

Next, at step S32, the erasing unit and over-erased correcting unit become the memory sector when the memory sector enable signal is set to be asserted (i.e. the 4K_ERS flag is 1 or logically true). Then, at step S32, for each memory block, the erasing and verifying process is sequentially performed on the memory sectors of the memory block, and then the verifying and the over-erased correcting process is sequentially performed on the memory sectors of the memory block. That is, while the memory block(s) has the at least one over-erased transistor memory cell, the erasing and over-erased correcting units become the memory sector from the memory block.

After the over-erased correcting and verifying process has been performed on the all memory sectors of each memory block (if the 4K_ERS flag is 1) or all memory blocks (if the 4K_ERS flag is 0), step S33 will be executed. At step S33, the verifying and post over-erased correcting process is sequentially performed on the memory blocks. Next, the erasing method is terminated.

In the embodiment, step S32 comprises steps S3211 through S3223, and the details of steps S3211 through S3223 are illustrated as follows. However, the implementation of step S32 of such embodiment is not used to limit the present disclosure.

At step S3211, the erasure verifying of the erasing and verifying process is performed on the memory block (if the 4K_ERS flag is 0) or the memory sector (if the 4K_ERS flag is 1) which an address indicates by the memory management apparatus, wherein whether the memory block or the memory sector is verified is determined according to the memory sector enable signal, and the memory sector enable signal is asserted when the OEC is performed on one of the memory blocks. Next, at step S3212, the memory management apparatus checks the verification result of step S3211. If the verification result shows the existence of the under-erased transistor memory cells in the memory block or the memory sector (i.e. verification fail), steps S3213 is then executed; otherwise, step S3212 is executed.

At steps S3213, the memory management apparatus erases the transistor memory cells of the memory block (if the 4K_ERS flag is 0) or the memory cell (if the 4K_ERS flag is 1) by injecting the erasing shot to the transistor memory cells of the memory block or the memory sector, wherein whether the memory block or the memory sector is erased is determined according to the memory sector enable signal. Next, at step S3214, the memory management apparatus sets the ERS flag to be 1 (i.e. logically true), and then step S3211 is executed again.

At step S3215, the memory management apparatus checks whether the address is equal to the maximum memory block address (i.e. MAX_64K) or the maximum memory sector address (i.e. MAX_4K), wherein whether the maximum memory block address (i.e. MAX_64K) or the maximum memory sector address (i.e. MAX_4K) is selected as the maximum address is determined according to the memory sector enable signal. If the address is not equal to the maximum memory block address (i.e. MAX_64K) when the memory sector enable signal is not asserted (i.e. the 4K_ERS flag is 0 or logically false), or equal to the maximum memory sector address (i.e. MAX_4K) when the memory sector enable signal is asserted (i.e. the 4K_ERS flag is 1 or logically true), step S3223 is executed; otherwise, step S3216 is executed.

At step S3223, the memory management apparatus adds the address with an increment, wherein the increment is determined according to the memory sector enable signal. That is, whether the increment is a sector offset or a block offset is determined according to the memory sector enable signal. After step S3223 is executed, step S3211 is executed again.

At step S3216, the memory management apparatus checks whether the ERS flag is equal to 1, so as to determine whether the erasing is performed on the memory blocks (if the 4K_ERS flag is 0) or the memory sectors (if the 4K_ERS flag is 1). If the ERS flag is equal to 1, step S3217 is executed; otherwise step S3222 is executed. When the ERS flag is equal to 0, it means no erasing is performed on memory blocks, or all memory sectors of the memory block have no under-erased transistor memory cell and no over-erased transistor memory cell.

At step S3217, the memory management apparatus performs the over-erased correcting and verifying process sequentially on the memory blocks (if the 4K_ERS flag is 0) or the memory sectors of the memory block (if the 4K_ERS flag is 1), wherein whether the over-erased correcting and verifying process is sequentially performed on the memory blocks or the memory sectors of the memory block is determined according to the memory sector enable signal. At step S3217, when the verification result shows the memory blocks (if the 4K_ERS flag is 0) or the memory sectors (if the 4K_ERS flag is 1) of the memory block have at least one over-erased memory cell, the OEC is performed on the memory block(s) (if the 4K_ERS flag is 0) or the memory sector(s) of the memory block (if the 4K_ERS flag is 1) which has the over-erased transistor memory cell(s) by injecting the OEC pulse (or OEC shot) to the transistor memory cells of the memory block(s) or the memory sector(s), and the OEC flag is set to be 1.

Next, at step S3218, the memory management apparatus checks the OEC flag to determine whether the OEC is performed on the memory block(s) or the memory sector(s). If the OEC flag is equal to 1, step S3219 is executed; otherwise, step S3218 is executed. At step S3219, the memory sector enable signal is set to be asserted (i.e. the 4K_ERS flag is 1), and step S3221 is next executed.

At step S3220, the memory management apparatus checks whether the address is the last sector address of the final memory block (i.e. LAST 4K) or the memory sector enable signal is not asserted (i.e. the 4K_ERS flag is 0). If the address is the last sector address of the final memory block (i.e. LAST 4K) or the memory sector enable signal is not asserted (i.e. the 4K_ERS flag is 0), step S33 is executed; otherwise, step S3221 is executed. In one case, after the over-erased correcting and verifying process is sequentially performed on the memory blocks, if no OEC is performed when the memory block have no over-erased transistor memory cell, the OEC flag is 0, the memory sector enable signal is not asserted (i.e. the 4K_ERS flag is 0), and step S33 is next executed. In other one case, the OEC was performed on at least one memory block and at least one memory sector in the past, no OEC is performed on the memory sectors of final the memory block now (i.e. OEC flag is 0 and the address is LAST 4K), and step S33 is next executed.

At step S3221, the memory management apparatus resets the ERS flag to be 0 and the OEC flag to be 0, and step S3211 is executed for performing the erasure verifying on the memory sector of the memory block (i.e. the 4K_ERS flag now is 1). At step S3222, the memory management apparatus check the address is equal to the maximum memory block address (i.e. MAX_64K). If the address is equal to the maximum memory block address (i.e. MAX_64K), step S33 is then executed; otherwise, step S3223 is executed for adds the address with block offset. Step S3223 is executed when the memory sector signal is asserted (i.e. the 4K_ERS flag is 1) and all memory sectors of the memory block has no under-erased transistor memory cell and no over-erased transistor memory cell (i.e. ERS flag=0 and OEC flag=0). If the memory block is not the final memory block, step S3223 is then executed, such that the address can indicate the next memory block, and the memory sectors of the memory block are sequentially performed with the verifying and the erasing process and the verifying and the over-erased correcting process.

Initially, the memory sector enable signal is not asserted, and generally, steps S3211 through S3215 and S3223 are executed for the memory blocks (assuming the memory blocks have the under-erased transistor memory cells initially), such that the erasing and verifying process is sequentially performed on the memory blocks. Then, steps S3216 through S3218 are executed for the memory blocks, such that the over-erased correcting and verifying process is sequentially performed on the memory blocks. Generally, the OEC is performed on at least one memory block (assuming the existence of over-erased transistor memory cell the in the at least one memory block), and step S3219 is executed to set the 4K_ERS flag to be 1.

Next, for each memory block, steps S3211 through S3222 are executed for performing the erasing and verifying process and the over-erased correcting and verifying process sequentially on the memory sectors of the memory block. Once, the erasing is performed on the at least one memory sector of the memory block, the over-erased correcting and verifying process is then sequentially performed on the memory sectors of the memory block. When no erasing is performed on the memory sectors of the memory block, the memory sectors of the next memory block are selected, and the erasing and verifying process and the over-erased correcting and verifying process are performed sequentially on the memory sectors of the next memory block. That is, the self-examining algorithm is formed.

Accordingly, by using the erasing method in the flash memory provided by the present disclosure, the do-loop between the erasing and verifying process and the over-erased correcting and verifying process can be eliminated under the assumption that the slow and fast transistor memory cell do not allocated in multiple bits (such as 16 bits) on a same bit line of a memory sector, and the existence of the under-erased transistor memory cell is prevented after the OEC is performed.

While the present disclosure has been described by means of specific embodiments, numerous modifications and variations could be made thereto by those skilled in the art without departing from the scope and spirit of the present disclosure set forth in the claims.

What is claimed is:

1. An erasing method used in a flash memory comprising at least one memory block divided into a plurality of memory sectors, comprising:
    performing an erasing and verifying process on the memory block, and setting an erasing flag to be logically true if the memory block is erased;
    performing an over-erased correcting and verifying process on the memory block if the erasing flag is logically true, setting an over-erased correction flag to be logically true and a memory sector enable signal to be asserted if an over-erased correction is performed on the memory block, and then resetting both of the erasing flag and the over-erased correction flag to be logically false;
    when the memory sector enable signal is asserted, performing the erasing and verifying process sequentially on the memory sectors of the memory block, and setting the erasing flag to be logically true if at least one of the memory sectors is erased; and
    when the memory sector enable signal is asserted and the erasing flag is logically true, performing the over-erased correcting and verifying process sequentially on the memory sectors of the memory block, setting the over-erased correction flag to be logically true if the over-erased correction is performed on at least one of the memory sectors, and then resetting both of the erasing flag and the over-erased correction flag to be logically false.

2. The erasing method according to claim 1, wherein the at least one memory block comprises a plurality of memory blocks, and the erasing and verifying process is sequentially performed on the memory blocks, wherein an address is used to indicate the memory block or the memory sector, the address is increased with a block offset after a verification result shows the memory block has no under-erased transistor memory cell, and the erasing flag is set to be logically true if at least one of the memory block is erased.

3. The erasing method according to claim 2, wherein the over-erased correcting and verifying process is sequentially performed on the memory blocks if the erasing flag is logically true, the over-erased correction flag is set to be logically true and the memory sector enable signal to be asserted if an over-erased correction is performed on at least one of the memory blocks, and then both of the erasing flag and the over-erased correction flag are reset to be logically false.

4. The erasing method according to claim 2, wherein the erasing and verifying process is performed on the memory sector of the memory block which the address indicates, the address is increased with a sector offset after a verification result shows memory sector of the memory block has no under-erased transistor memory cell, and the erasing flag is set to be logically true if at least one of the memory sectors of the memory block is erased.

5. The erasing method according to claim 1, wherein before the erasing and verifying process on the memory block is performed on the memory block, a pre-programming and verifying process is performed on the memory block.

6. The erasing method according to claim 1, wherein when the memory block or the memory sectors have no under-erased transistor memory cell and the erasing flag is logically false, or the memory block has no over-erased transistor memory cell and the memory sector enable signal is not asserted, or the memory sectors has no over-erased transistor memory cell and the memory sector enable signal is asserted, a post over-erased correcting and verifying process is performed on the memory block.

7. An erasing method used in a flash memory comprising memory blocks, and each of the memory blocks is divided into a plurality of memory sectors, comprising:
    performing an erasing and verifying process sequentially on the memory blocks or the memory sectors of the memory block according to a memory sector enable signal, and setting an erasing flag to be logically true if at least one of the memory blocks or at least one of the memory sectors is erased; and
    performing an over-erased correcting and verifying process sequentially on the memory blocks or the memory sectors of the memory block according to the memory sector enable signal if the erasing flag is logically true, setting an over-erased correction flag to be logically true and the memory sector enable signal to be asserted if an over-erased correction is performed on at least one of the memory blocks or at least one of the memory sectors of the memory block, and then resetting both of the erasing flag and the over-erased correction flag to be logically false.

8. The erasing method according to claim 7, wherein when the memory sector enable signal is not asserted, the erasing and verifying process is performed sequentially on the memory blocks, and the over-erased correcting and verifying process is performed sequentially on the memory blocks; when the memory sector enable signal is asserted, the erasing and verifying process is performed sequentially on the memory sectors, and the over-erased correcting and verifying process is performed sequentially on the memory sectors.

9. A flash memory, comprising:
    a memory module, comprising at least one memory block divided into a plurality of memory sectors; and
    a memory management apparatus, electrically connected to the memory module;
    wherein the memory management apparatus is used for:
        performing an erasing and verifying process on the memory block, and setting an erasing flag to be logically true if the memory block is erased;
        performing an over-erased correcting and verifying process on the memory block if the erasing flag is logically true, setting an over-erased correction flag to be logically true and a memory sector enable signal to be asserted if an over-erased correction is performed on the memory block, and then resetting both of the erasing flag and the over-erased correction flag to be logically false;
        when the memory sector enable signal is asserted, performing the erasing and verifying process sequentially on the memory sectors of the memory block, and setting the erasing flag to be logically true if at least one of the memory sectors is erased; and
        when the memory sector enable signal is asserted and the erasing flag is logically true, performing the over-erased correcting and verifying process sequentially on the memory sectors of the memory block, setting the over-erased correction flag to be logically true if the over-erased correction is performed on at least one of the memory sectors, and then resetting both of the erasing flag and the over-erased correction flag to be logically false.

10. The flash memory according to claim 9, wherein the at least one memory block comprises a plurality of memory blocks, and the erasing and verifying process is sequentially performed on the memory blocks, wherein an address is used to indicate the memory block or the memory sector, the address is increased with a block offset after a verification result shows the memory block has no under-erased transistor memory cell, and the erasing flag is set to be logically true if at least one of the memory block is erased.

11. The flash memory according to claim 10, wherein the over-erased correcting and verifying process is sequentially performed on the memory blocks if the erasing flag is logically true, the over-erased correction flag is set to be logically true and the memory sector enable signal to be asserted if an over-erased correction is performed on at least one of the memory blocks, and then both of the erasing flag and the over-erased correction flag are reset to be logically false.

12. The flash memory according to claim 10, wherein the erasing and verifying process is performed on the memory sector of the memory block which the address indicates, the address is increased with a sector offset after a verification result shows memory sector of the memory block has no under-erased transistor memory cell, and the erasing flag is set to be logically true if at least one of the memory sectors of the memory block is erased.

13. The flash memory according to claim 9, wherein before the erasing and verifying process on the memory block is performed on the memory block, a pre-programming and verifying process is performed on the memory block.

14. The flash memory according to claim 9, wherein when the memory block or the memory sectors have no under-erased transistor memory cell and the erasing flag is logically false, or the memory block has no over-erased transistor memory cell and the memory sector enable signal is not asserted, or the memory sectors has no over-erased transistor memory cell and the memory sector enable signal is asserted, a post over-erased correcting and verifying process is performed on the memory block.

* * * * *